United States Patent
Lee

(10) Patent No.: US 8,796,104 B2
(45) Date of Patent: Aug. 5, 2014

(54) SEMICONDUCTOR DEVICE AND METHOD OF MANUFACTURING THE SAME

(75) Inventor: Chang Eun Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 82 days.

(21) Appl. No.: 13/458,809

(22) Filed: Apr. 27, 2012

(65) Prior Publication Data

US 2013/0093054 A1 Apr. 18, 2013

(30) Foreign Application Priority Data

Oct. 14, 2011 (KR) .................. 10-2011-0105469

(51) Int. Cl.
*H01L 21/20* (2006.01)
(52) U.S. Cl.
USPC .................. 438/384; 257/E21.004
(58) Field of Classification Search
CPC ........... H01L 21/32155; H01L 27/1112; H01L 28/24
USPC .................................. 438/383, 384
See application file for complete search history.

(56) References Cited

U.S. PATENT DOCUMENTS 6,979,637 B2 *  12/2005  Beach et al. ............. 438/384
7,425,753 B2 *   9/2008  Kato et al. ................ 257/536

FOREIGN PATENT DOCUMENTS

JP      2009-259895 A    11/2009
KR   10-2011-0078953 A    7/2011

OTHER PUBLICATIONS

Office Action Dated Jan. 14, 2013; Korean Patent Application No. 10-2011-0105469.
English Abstract for Korean Patent Publication No. 10-2011-0078953A, Published Jul. 7, 2011.
English Abstract for Japanese Patent Publication No. 2009-259895, Published Nov. 5, 2009.

* cited by examiner

*Primary Examiner* — Chandra Chaudhari
(74) *Attorney, Agent, or Firm* — Andrew D. Fortney; Murabito Hao & Barnes LLP

(57) ABSTRACT

A semiconductor device and a method of manufacturing the same are disclosed. The semiconductor device includes a first insulation layer on or over a semiconductor substrate, metal patterns on or over the first insulation layer, a thin film resistor pattern disposed on or over the metal patterns, and an anti-reflection layer between the thin film resistor pattern and the metal patterns.

20 Claims, 5 Drawing Sheets

SEMICONDUCTOR DEVICE AND METHOD OF MANUFACTURING THE SAME

CROSS-REFERENCE TO RELATED APPLICATIONS

This application claims under 35 U.S.C. §119 the benefit of Korean Patent Application No. 10-2011-0105469, filed Oct. 14, 2011, which is hereby incorporated by reference in its entirety.

BACKGROUND

Passive devices perform important functions in an electronic system. Recently, the making of miniaturized, multi-functional, and economical electronic appliances has become popular, and is giving rise to requirements for passive devices to be fabricated in the form of an array, a network, and a built-in passive device. Such passive devices sense, monitor, transmit, reduce, and control voltage.

Resistors as passive devices suppress a flow of electric charge or current, thereby controlling the amount of current. Such passive devices may be classified as a thin film resistor, in which a metal layer is thinly deposited to form a pattern, and an active layer resistor in an active area. Thin film resistors are generally disposed between metal lines in a semiconductor device.

FIG. 1 is a cross-sectional view of a conventional semiconductor device including metal patterns and a thin film resistance pattern. The semiconductor device of FIG. 1 includes a semiconductor substrate 10, a first dielectric 20 on the substrate 10, a lower metal line 30 on the first dielectric 20, and metal patterns 40. Also, a second dielectric 50, a thin film resistor pattern 60, and a third dielectric 70 may be formed over the metal patterns 40, and an upper metal line 80, and a via 90 may be successively formed over the lower metal line 30 and over or adjacent to the metal patterns 40.

As described above, in the process of manufacturing the semiconductor device, the thin film resistor pattern 60 may have a nonuniform profile, width, or shape due to the presence of the metal patterns 40 under some portions of the thin film resistor pattern 60, and the absence of the metal patterns 40 under other portions of the thin film resistor pattern 60. That is, in an exposure process performed on a photoresist material for patterning a thin film resistor material and forming the thin film resistor pattern 60, a portion of the light may be transmitted through the thin film resistor material due to a thinness of the thin film resistor. The transmitted light is reflected by the metal patterns 40 located under the thin film resistor back to the photoresist over the thin film resistor material during the exposure process, and thus forming a photoresist pattern that has some relatively wide portions. The photoresist pattern is then used to pattern the thin film resistor material and form the thin film resistor pattern 60. As a result, a profile of the thin film resistor pattern 60 may be deformed.

FIG. 2 is an overhead photograph of a thin film resistor pattern formed according to the conventional manufacturing method described above. The photograph shows that a portion of the thin film resistor pattern formed in an area that contains underlying metal patterns has a uniform width, but the thin film resistor pattern disposed in an area that does not contain underlying metal patterns is reduced in width.

That is, referring to FIGS. 1 and 2, in the conventional method of manufacturing the semiconductor device including the metal patterns and the thin film resistor pattern, it may be difficult to form a thin film resistor pattern having a uniform profile. As a result, a resistance of the thin film resistor may be different from that desired by a designer.

SUMMARY OF THE INVENTION

Embodiments provide a semiconductor device having a desired resistance by providing a thin film resistor pattern having a regular and/or uniform profile.

In one embodiment, a semiconductor device includes: a first insulation layer on or over a semiconductor substrate; metal patterns on or over the first insulation layer; a thin film resistor pattern on or over the metal patterns; and an anti-reflection layer between the thin film resistor pattern and the metal patterns.

In another embodiment, a method of manufacturing a semiconductor device includes: forming a first insulation layer on a semiconductor substrate; depositing a metal layer on or over the first insulation layer; patterning the metal layer to form metal patterns; forming a second insulation layer on or over the first insulation layer and the metal patterns; forming an anti-reflection layer on or over the second insulation layer; forming a third insulation layer on or over the anti-reflection layer; and forming a thin film resistor layer on or over the third insulation layer and patterning the thin film resistor layer to form a thin film resistor pattern.

Details of various embodiments of the present invention are set forth in the accompanying drawings and the description below. However, the following description of the invention does not limit the scope of the invention as defined in the appended claims. It will be understood by those skilled in the art that various changes, equivalents, and modifications may be made without departing from the scope of the present invention as defined in the claims. Other features will be apparent from the description and drawings, and from the claims.

DETAILED DESCRIPTION OF THE EMBODIMENTS

Hereinafter, embodiments of a semiconductor device and a method of manufacturing the same in accordance with the present invention will be described with reference to the accompanying drawings.

Figure 3:
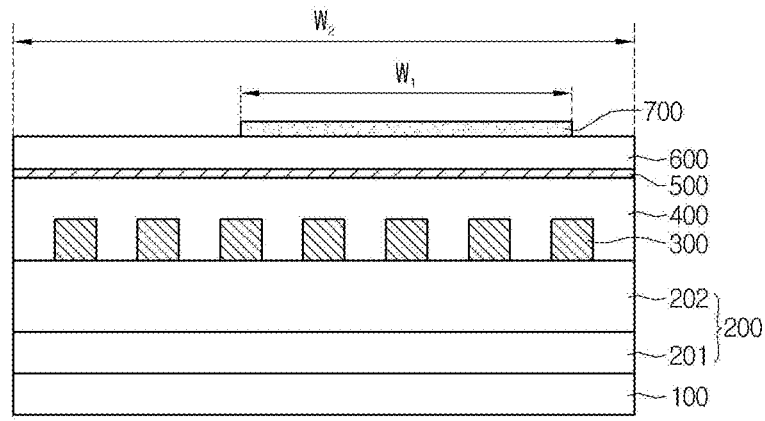
FIG. 3 is a cross-sectional view of a semiconductor device according to a first embodiment.

FIG. 3 is a cross-sectional view of a semiconductor device according to a first embodiment. FIGS. 4 to 9 are cross-sectional views illustrating a process of manufacturing the semiconductor device according to the first embodiment.

Referring to FIG. 3, a semiconductor device according to the first embodiment includes a first insulation layer 200 on or over a semiconductor substrate 100, metal patterns 300 on or over the first insulation layer 200, a thin film resistor pattern 700 over the metal patterns 300, and an anti-reflection layer 500 between the thin film resistor pattern 700 and the metal patterns 300. In addition, the semiconductor device according to the first embodiment may further include a second insulation layer 400 on or over the metal patterns 300 and a third insulation layer 600 on or over the anti-reflection layer 500.

Figure 4:
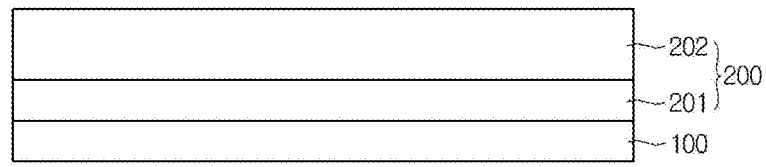
FIGS. 4 to 9 are cross-sectional views illustrating a process of manufacturing the semiconductor device according to the first embodiment.

Referring to FIG. 4, a first insulation layer 200 is formed on a semiconductor substrate 100. The semiconductor substrate 100 may be a single-crystal silicon wafer, or a single-crystal silicon wafer with one or more layers of epitaxial silicon grown thereon. The first insulation layer 200 may comprise an oxide layer (e.g., a silicon oxide, formed by chemical vapor deposition [CVD] of a silicon source such as tetraethyl-orthosilicate (TEOS) or silane and an oxygen source such as dioxygen [$O_2$] and/or ozone [$O_3$], etc.).

Also, the first insulation layer 200 may be formed as a single layer or a plurality of layers. For example, the first insulation layer 200 may include a first insulation sublayer 201 and a second insulation sublayer 202 on or over the semiconductor substrate 100. Here, the first insulation sublayer 201 may be a pre-metal-dielectric (PMD; e.g., a silicon oxide, formed by CVD of a silicon source such as tetraethyl-orthosilicate (TEOS) or silane and an oxygen source such as dioxygen [$O_2$] and/or ozone [$O_3$], a spin on glass [SOG], a borophosphosilicate glass [BPSG], a phosphosilicate glass [PSG], etc.), and the second insulation sublayer 202 may be an inter-metal dielectric (IMD; e.g., a silicon oxide, formed by CVD of a silicon source such as tetraethyl-orthosilicate (TEOS) or silane and an oxygen source such as dioxygen [$O_2$] and/or ozone [$O_3$], a SOG, a BPSG, a PSG, a low k dielectric such as fluorosilicate glass [FSG], polyimide, HSG, etc.).

Figure 5:
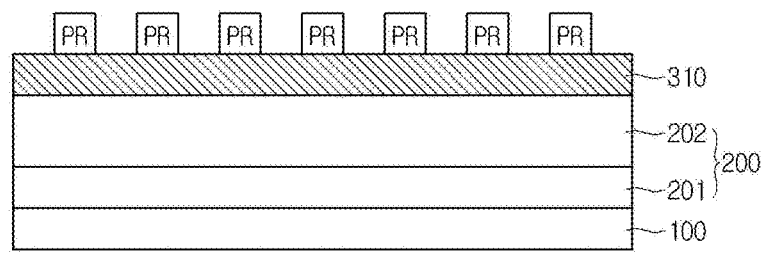
Figure 6:
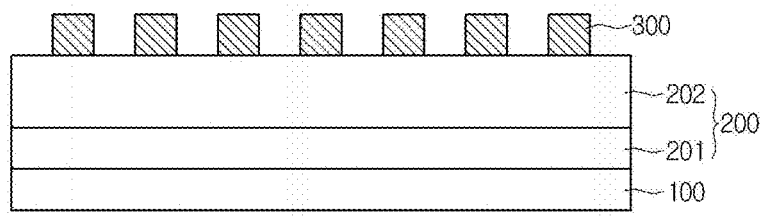

Referring to FIGS. 5 and 6, metal patterns 300 are formed on or over the first insulation layer 200. A metal layer 310 (e.g., comprising aluminum deposited on a Ti/TiN bilayer, capped with a TiN-on-Ti bilayer, etc.) may be deposited on the first insulation layer 200, and a photoresist pattern (PR) may be formed on the metal layer 310. Then, a photolithography process and an etching process may be performed to form the metal patterns 300. After the metal patterns 300 are formed, the photoresist pattern (PR) is removed by an asking or stripping process.

Referring to FIG. 6, the metal patterns 300 may be formed at regular intervals (e.g., with a consistent spacing between adjacent metal patterns), but the present embodiments are not limited thereto. That is, the metal patterns 300 may alternatively be spaced at irregular or varying distances.

Figure 7:
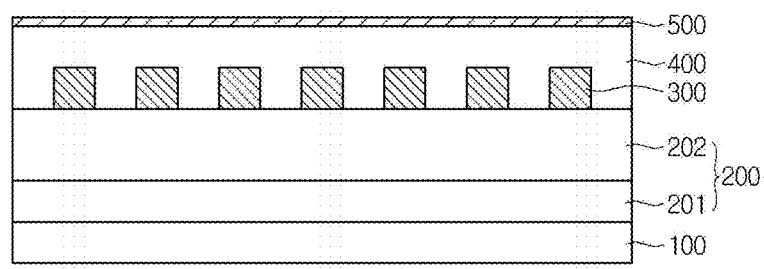

Referring to FIG. 7, a second insulation layer 400 and an anti-reflection layer 500 may be sequentially formed on or over the metal patterns 300. The anti-reflection layer 500 may comprise an inorganic-based material, but is not limited thereto. For example, the anti-reflection layer 500 may comprise a silicon oxynitride (SiON) layer. A chemical vapor deposition process may be performed using $SiH_4$, $N_2O$, and He as source gases to form the SiON anti-reflection layer 500.

The anti-reflection layer 500 may be uniformly distributed on or over the second insulation layer 400. For example, the anti-reflection layer 500 may be formed on an entire top surface of the second insulation layer 400. The anti-reflection layer 500 may have a thickness of about 50 Å to about 500 Å (e.g., about 100 Å to about 400 Å, about 150 Å to about 350 Å, or any value or range of values therein). The anti-reflection layer 500 will be described below in detail together with a thin film resistor pattern 700.

Figure 8:
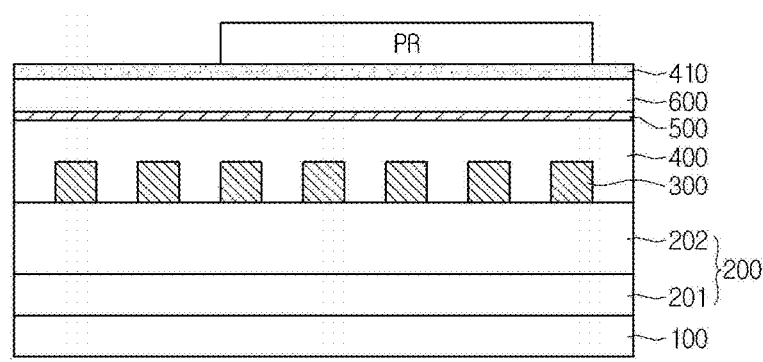

Referring to FIG. 8, a third insulation layer 600 and a thin film resistor layer 410 are formed on or over the anti-reflection layer 500. For example, the third insulation layer 600 may be an oxide layer (e.g., a silicon oxide, formed by CVD of a silicon source such as tetraethyl-orthosilicate (TEOS) or silane and an oxygen source such as dioxygen [$O_2$] and/or ozone [$O_3$], SOG, etc.), but is not limited thereto. The third insulation layer 600 may have a thickness of about 1000 Å to about 5000 Å (e.g., about 1500 Å to about 4000 Å, about 2000 Å to about 3000 Å, or any value or range of values therein).

A resistor material may be used to form the thin film resistor layer 410 without specific limitations. For example, the thin film resistor layer 410 may comprise at least one compound selected from the group consisting of CrSi, NiCr, TaN, $CrSi_2$, CrSiN, CrSiO, and combinations thereof, but is not limited thereto.

For example, the thin film resistor layer 410 may be manufactured by depositing SiCr or NiCr on or over the third insulation layer 600 at a thickness of about 10 Å to about 500 Å through by PVD (e.g., a sputtering process).

Figure 9:
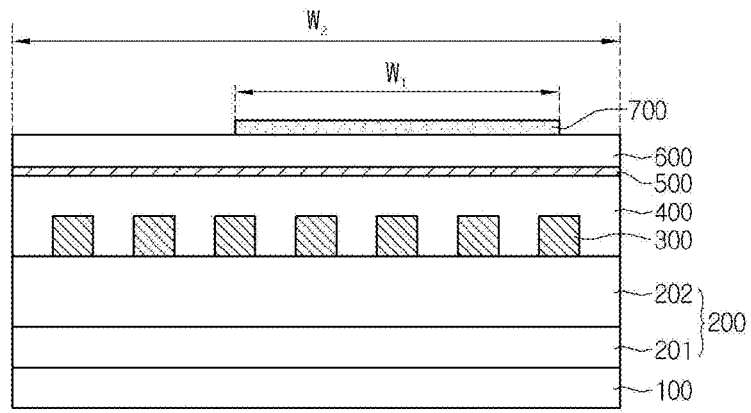

Thereafter, referring to FIG. 9, a photoresist pattern (PR) may be formed on or over the thin film resistor layer 410. The photoresist pattern may be formed by depositing a photoresist material (e.g., positive photoresist) over the thin film resistor layer 410 and then patterning the photoresist material in a photolithography process. The photoresist pattern may define the thin film resist pattern 700. Subsequently, an etching process may be performed using the photoresist pattern as a mask to form the thin film resistor pattern 700.

Figure 1:
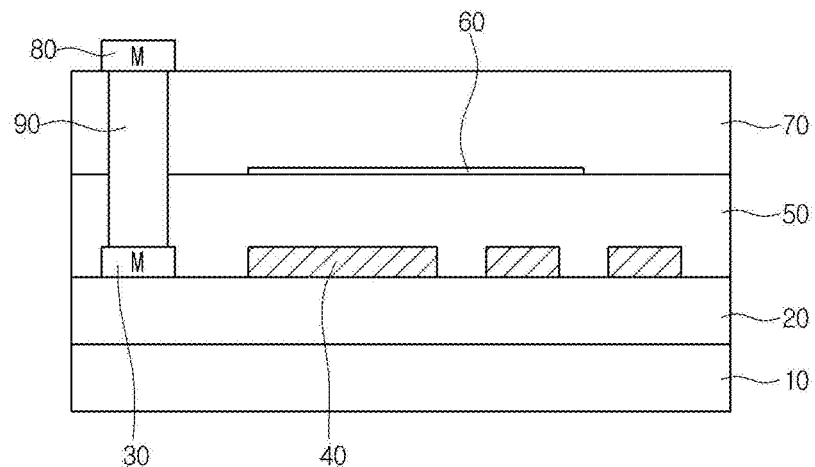
FIG. 1 is a cross-sectional view illustrating metal patterns and a thin film resistor pattern of a semiconductor device formed by a conventional manufacturing process.
Figure 2:
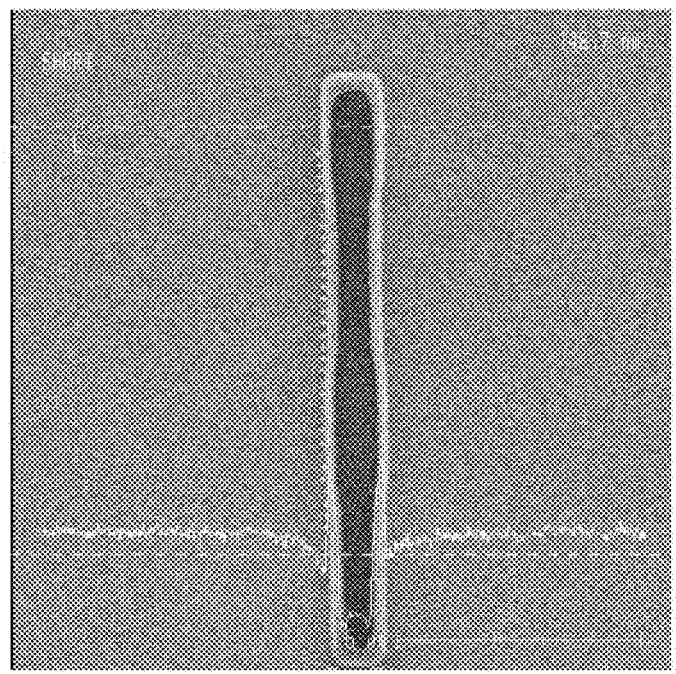
FIG. 2 is an overhead photograph showing a profile of the thin film resistor pattern manufactured by a conventional manufacturing process.

The thin film resistor pattern 700, when viewed from overhead, may have a substantially rectangular profile (e.g., similar to the profile shown in FIG. 2). For instance, the profile of the thin film resistor pattern 700 may have parallel sides that extend longer (i.e., are longer) than the other sides of the profile running perpendicular thereto. The length $W_1$ in FIG. 9 may represent the longer sides of the profile of the thin film resistor pattern 700, which extend in a first direction. However, the thin film resistor pattern 700 is not limited to such a shape. For example, the thin film resistor pattern 700 may have a square or another alternative shape. The term 'extend' used herein may denote that a ratio of a long axis of the thin film transistor pattern 700 to a short axis thereof is 5:1 or greater (e.g., about 5:1 to about 100:1, or any value or range of values therein). However, the ratio of the sides of the thin film transistor pattern 700 is not limited to such ratios.

The thin film resistor pattern 700 may be formed as a thin film. For example, the thin film resistor pattern 700 may have a thickness ranging from about 10 Å to about 500 Å (e.g., about 25 Å to about 400 Å, about 50 Å to about 300 Å, about 100 Å to about 250 Å, or any value or range of values therein). Thus, in the exposure process for manufacturing the thin film resistor pattern 700, a portion of the light used in the exposure process to form a photoresist pattern may be transmitted through the thin film resistor layer 700, and may reach the metal patterns 300, where it may be reflected back to the photoresist material. In the absence of the anti-reflection layer (e.g., as in a conventional semiconductor device) the reflected light may alter the pattern of the photoresist material during the exposure process and thereby cause deformation of the thin film resistor pattern (see, e.g., the Background discussion above). To solve the above-described limitation, the current embodiment includes the anti-reflection layer 500 under the thin film resistor pattern 700. The anti-reflection layer 500 is intended to prevent the reflection of light that passes through the thin film resistor pattern from underlying metal patterns back to the photoresist material during the photoresist exposure process, where the reflected light can distort the photoresist pattern.

The anti-reflection layer 500 is disposed between the thin film resistor pattern 700 and the meal patterns 300. For example, the anti-reflection layer 500 may be between the second insulation layer 400 and the third insulation layer 600.

Here, the anti-reflection layer 500 may overlap the thin film resistor pattern 700 and the metal patterns 300. For example, from an overhead perspective, the two dimensional area of the thin film resistor pattern 700 may completely overlap with the anti-reflection layer 500 directly underlying it. Stated another way, the two-dimensional area (e.g., footprint) of the thin film resistor pattern 700 may be completely included within the periphery of the two-dimensional area of the underlying anti-reflection layer 500 and/or overlap the anti-reflection layer 500. In one embodiment, the anti-reflection layer 500 may have a width W2 greater than that W1 of the thin film resistor pattern 700, but is not limited thereto.

Referring to FIGS. 3 and 9, the anti-reflection layer 500 may be formed on or over an entire top surface of the second insulation layer 400, but the present embodiments are not limited thereto. In one embodiment, the anti-reflection layer 500 of the semiconductor device may be formed on or over only a portion of the second insulation layer 400.

Figure 10:
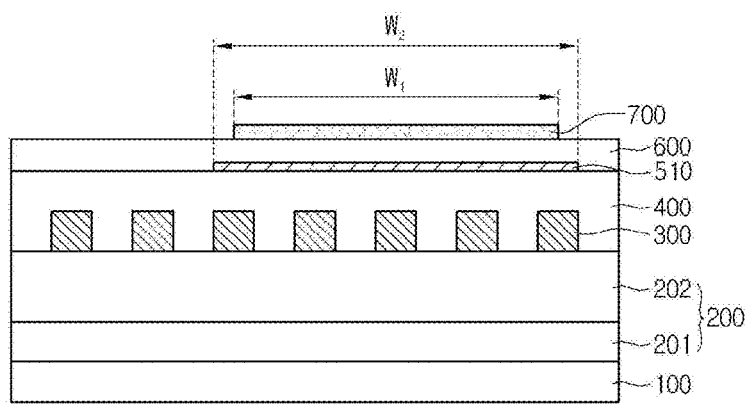
FIGS. 10 and 11 are cross-sectional views illustrating a semiconductor device according to a second embodiment.
Figure 11:
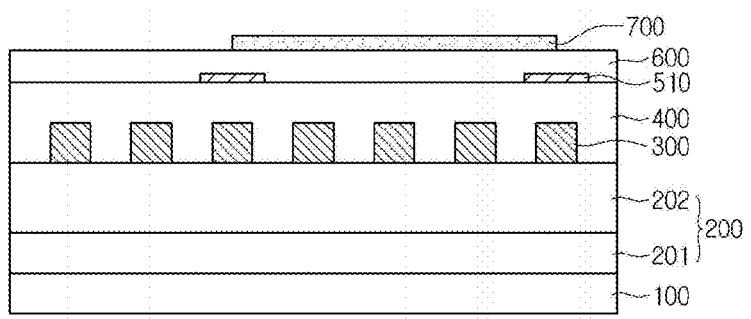

FIGS. 10 and 11 are cross-sectional views illustrating a semiconductor device according to a second embodiment. Referring to FIG. 10, an anti-reflection layer 510 may be formed on only a portion of a top surface of the second insulation layer 400. That is, the anti-reflection layer 510 may be patterned to be on a portion of the top surface of the second insulation layer 400.

Referring to FIG. 10, the anti-reflection pattern 510 may be formed to correspond to the periphery of the overlying thin film resistor pattern 700. In detail, the anti-reflection pattern 510 may be formed to correspond to the two-dimensional surface area (e.g., footprint) of the overlying thin film resistor pattern 700. For example, the thin film resistor pattern 700 may be within the periphery of the directly underlying anti-reflection pattern 510, and thus be completely overlapped by the anti-reflection pattern 510. The anti-reflection pattern 510 may have a width W2 greater than that W1 of the thin film resistor pattern 700, but the present embodiments are not limited thereto. Here, the anti-reflection pattern 510 may completely overlap both the length and width dimensions of the thin film resistor pattern 700 from an overhead perspective. Thus, the anti-reflection pattern 510 blocks light from passing to the underlying metal patterns 300 during a photoresist exposure process (e.g., a forming a photoresist pattern to define the anti-reflection pattern 510), and thereby prevents the reflection of light from the metal pattern 300 to the perimeter of the photoresist pattern where it may distort the photoresist pattern.

Referring to FIG. 11, the anti-reflection pattern 520 may be formed to correspond to only the periphery of the thin film resistor pattern 700 on the anti-reflection pattern 520, but the present embodiments are not limited thereto. In this embodiment, the anti-reflection layer 520 underlies the periphery or outline of the overlying thin film resistor pattern 700 in order to prevent the reflection of light to the periphery of the photoresist pattern (e.g., which defines the thin film resistor pattern 700) during an photoresist exposure and/or patterning process. That is, the anti-reflection pattern 520 may have an annular shape and be formed to correspond to only the periphery of the thin film resistor pattern 700, but may not be under a center region of the thin film resistor pattern 700.

That is, the anti-reflection pattern 520 according to the second embodiment may be formed to correspond to the inside (e.g., center area) and periphery of the overlying thin film resistor pattern 700 may correspond only to the periphery of the overlying thin film resistor pattern 700 in order to prevent the reflection of light from the metal patterns 300 to the periphery of the photoresist pattern defining the thin film resistor pattern 700 during the photoresist exposure process. Thus, in the semiconductor device according to the second embodiment, the thin film resistor pattern 700 having a regular, uniform, and controllable profile may be manufactured.

Figure 12:
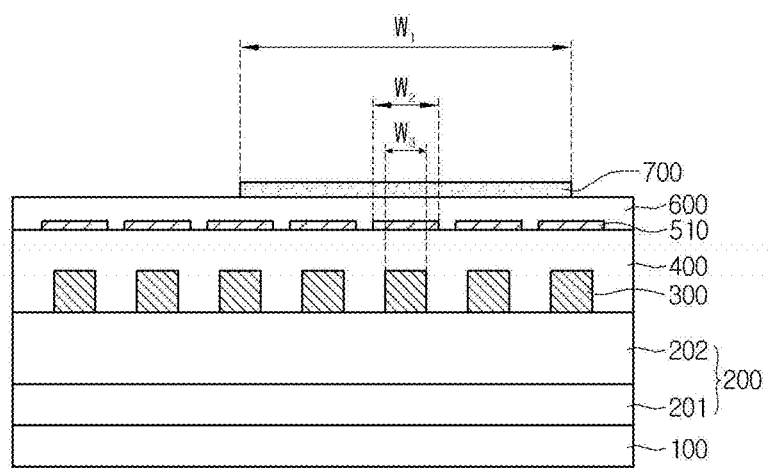
FIG. 12 is a cross-sectional view of a semiconductor device according to a third embodiment.

FIG. 12 is a cross-sectional view of a semiconductor device according to a third embodiment. Referring to FIG. 12, the anti-reflection layer includes a plurality of anti-reflection patterns 530. Each of the anti-reflection patterns 530 may correspond to one of the underlying metal patterns 300. For example, one of the plurality of anti-reflection pattern 530 may correspond to each of the metal patterns 300 in a one-to-one arrangement. Here, each of the anti-reflection patterns 530 may have a width W2 greater than a width W3 of the underlying metal pattern. Thus, each anti-reflection pattern may completely overlap the underlying metal pattern from an overhead perspective. Also, a portion of the plurality of anti-reflection patterns 530 may be disposed to correspond to the periphery of the thin film resistor pattern 700.

The anti-reflection patterns 530 according to the third embodiment may correspond to the metal patterns 300 and the periphery of the thin film resistor pattern 700. Specifically, the anti-reflection patterns 530 may overlap with the periphery of the overlying thin film resistor pattern 700 and completely overlap the underlying metal patterns 300. Thus, in accordance with the third embodiment, a semiconductor device having a thin film resistor pattern 700 with a regular, uniform, and controllable profile may be manufactured.

In the semiconductor device according to the embodiments of the present invention, the anti-reflection layer located between the thin film resistor pattern and the metal patterns allows for the formation of a thin film resistor pattern having a regular, uniform, and controllable profile. Accordingly, the semiconductor device may have stable resistance characteristics, and any mismatch thereof may be reduced or eliminated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. When a particular feature, structure, or characteristic is described in connection with any one embodiment, one skilled in the art will understand that such feature, structure, or characteristic may be included in other embodiments with which the feature, structure, or characteristic is compatible.

What is claimed is:

1. A method of manufacturing a semiconductor device, the method comprising:
    forming a first insulation layer on or over a semiconductor substrate;
    depositing a metal layer on or over the first insulation layer and patterning the metal layer to form metal patterns;
    forming a second insulation layer on or over the first insulation layer and the metal patterns;
    depositing and patterning an anti-reflection layer on or over the second insulation layer;
    forming a third insulation layer on or over the anti-reflection layer; and
    forming a thin film resistor layer on or over the third insulation layer and patterning the thin film resistor layer to form a thin film resistor pattern, wherein the patterned anti-reflection layer corresponds to a periphery of the thin film resistor pattern.

2. The method according to claim 1, wherein depositing and patterning the anti-reflection layer comprises depositing an anti-reflection material on the second insulation layer and patterning the anti-reflection material.

3. The method according to claim 1, wherein the anti-reflection layer has a width that is greater than a width of the thin film resistor pattern.

4. The method according to claim 1, wherein the anti-reflection layer directly underlies and has a larger area than the thin film resistor pattern.

5. The method according to claim 1, wherein patterning the anti-reflection layer comprises patterning the anti-reflection material to form a plurality of antireflection patterns, each corresponding to one of the metal patterns.

6. The method according to claim 5, wherein each of the plurality of antireflection layer patterns has a greater width that a width of the corresponding metal pattern.

7. The method according to claim 5, wherein each of the plurality of antireflection patterns directly overlies and completely covers the corresponding metal pattern.

8. The method according to claim 1, wherein forming the first insulation layer comprises forming a plurality of insulation layers.

9. The method according to claim 8, wherein forming the first insulation layer comprises forming an oxide layer by chemical vapor deposition of a silicon source and an oxygen source.

10. The method according to claim 9, wherein the silicon source comprises tetraethyl-orthosilicate or a silane, and the oxygen source comprises oxygen and/or ozone.

11. The method according to claim 1, wherein depositing the metal layer comprises depositing an aluminum material on a Ti/TiN bilayer.

12. The method according to claim 1, wherein patterning the metal layer comprises forming a first photoresist pattern on the metal layer.

13. The method according to claim 11, wherein patterning the metal layer further comprises photolithographic and etching processes.

14. The method according to claim 1, wherein adjacent metal patterns are at regular intervals or have a consistent spacing therebetween.

15. The method according to claim 1, the anti-reflection layer comprises SiON.

16. The method according to claim 15, wherein depositing the anti-reflection layer comprises a chemical vapor deposition process using $SiH_4$ and $N_2O$.

17. The method according to claim 1, wherein the anti-reflection layer has a thickness of 50-500 Å.

18. The method according to claim 1, wherein the third insulation layer has a thickness of 1000-5000 Å.

19. The method according to claim 1, wherein forming thin film resistor pattern comprises forming a second photoresist pattern on or over the thin film resistor layer.

20. The method according to claim 19, wherein forming thin film resistor pattern comprises etching the thin film resistor layer using the second photoresist pattern as a mask.

* * * * *